United States Patent
Seigler

(10) Patent No.: US 7,019,371 B2
(45) Date of Patent: Mar. 28, 2006

(54) CURRENT-IN-PLANE MAGNETIC SENSOR INCLUDING A TRILAYER STRUCTURE

(75) Inventor: Michael Allen Seigler, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 110 days.

(21) Appl. No.: 10/764,720

(22) Filed: Jan. 26, 2004

(65) Prior Publication Data

US 2005/0161752 A1 Jul. 28, 2005

(51) Int. Cl.
*H01L 29/82* (2006.01)

(52) U.S. Cl. .................. 257/425; 257/425; 257/422

(58) Field of Classification Search ................ 257/425, 257/421, 422, 427
See application file for complete search history.

(56) References Cited

U.S. PATENT DOCUMENTS

| | | | |
|---|---|---|---|
| 4,524,401 A | 6/1985 | Uchida et al. | |
| 5,159,513 A | 10/1992 | Dieny et al. | |
| 5,206,590 A | 4/1993 | Dieny et al. | |
| 5,428,491 A | 6/1995 | Smith | |
| 5,576,914 A | 11/1996 | Rottmayer et al. | |
| 5,784,224 A | 7/1998 | Rottmayer et al. | |
| 5,798,896 A | 8/1998 | Araki et al. | |
| 5,818,685 A | 10/1998 | Thayamballi et al. | |
| 5,880,912 A | 3/1999 | Rottmayer | |
| 5,883,763 A | 3/1999 | Yuan et al. | |
| 6,157,525 A | 12/2000 | Iwasaki et al. | |
| 6,256,176 B1 | 7/2001 | Mao et al. | |
| 6,356,420 B1 | 3/2002 | Everitt | |
| 6,441,611 B1 * | 8/2002 | Seyama ....................... 324/252 |
| 6,667,862 B1 | 12/2003 | Zhu | |
| 2002/0131214 A1 | 9/2002 | Covington et al. | |
| 2003/0026049 A1 | 2/2003 | Gill | |

FOREIGN PATENT DOCUMENTS

| EP | 0789250 A2 | 8/1997 |
|---|---|---|
| EP | 0676746 B1 | 8/1999 |

* cited by examiner

*Primary Examiner*—David Nelms
*Assistant Examiner*—Thinh T Nguyen
(74) *Attorney, Agent, or Firm*—Robert P. Lenart, Esq.; Pietragallo, Bosick & Gordon LLP

(57) ABSTRACT

A current-in-plane magnetic sensor comprises a sensor stack including first and second layers of ferromagnetic material, a first nano-oxide layer positioned adjacent to the first layer of ferromagnetic material, and a layer of non-magnetic material positioned between the first and second layers of ferromagnetic material, wherein the thickness of the non-magnetic layer is selected to provide antiferromagnetic coupling between the first and second ferromagnetic layers, a magnetic field source for biasing the directions of magnetization of the first and second layers of ferromagnetic material in directions approximately 90° with respect to each other, a first lead connected to a first end of the sensor stack, and a second lead connected to a second end of the sensor stack. Disc drives that use the current-in-plane magnetic sensor are also included.

21 Claims, 14 Drawing Sheets

CURRENT-IN-PLANE MAGNETIC SENSOR INCLUDING A TRILAYER STRUCTURE

FIELD OF THE INVENTION

This invention relates to magnetic sensors, and more particularly to current-in-plane magnetic sensors.

BACKGROUND OF THE INVENTION

Current-in-plane spin-valve (CIP-SV) magnetic sensors have been used as read sensors in magnetic disc drives. It has been predicted that the current-in-plane spin-valve (CIP-SV) will not be able to be used in discs having data densities beyond ~100 Gbpsi. Other read sensor alternatives such as tunneling magnetoresistance sensors and current-perpendicular-to-plane (CPP) giant magnetoresistance sensors are being explored to replace the CIP-SV. There are issues with both of these types of sensors that are delaying them from being incorporated into products. Because of the vast amount of experience with CIP sensors, it would be advantageous to be able to use the CIP sensor in disc drives having data densities beyond 100 Gbpsi.

A general rule of thumb equation that gives the output voltage for a read sensor is $\Delta V = I_b * DR_{sheet}(\text{width/length}) * \epsilon$, where $I_b$ is the bias current, $DR_{sheet}$ is the maximum change in the sheet resistance of the sensor, width and length are the width and length of the sensor, and $\epsilon$ is an efficiency factor that takes into account things such as the sensitivity lost when patterning the sheet film into a final read head structure. For the CIP-SV, the $DR_{sheet}$ has reached its maximum around 3 to 4 Ω/square. The maximum $I_b$ is limited by such things as Joule heating and asymmetry induced by the self fields from the bias current.

Spin valves include two layers of ferromagnetic material separated by a non-magnetic (NM) spacer layer. The direction of magnetization of one of the layers of ferromagnetic (FM) material, called the free layer, can be changed by interacting with an external magnetic field. The direction of magnetization of the other layer of ferromagnetic material, called the pinned layer, is fixed. Antiferromagnetic (AFM) material is needed in the CIP-SV to pin the pinned layer so that both an AFM and FM state can be achieved between the pinned and free layers when reading bits from the media.

This invention seeks to overcome the limitations spin valve CIP sensors by providing a CIP sensor that can produce a larger output from a smaller sensor, and does not require a pinning layer.

SUMMARY OF THE INVENTION

A current-in-plane magnetic sensor constructed in accordance with this invention comprises a sensor stack including first and second layers of ferromagnetic material, a first nano-oxide layer positioned adjacent to the first layer of ferromagnetic material, and a layer of non-magnetic material positioned between the first and second layers of ferromagnetic material, wherein the thickness of the non-magnetic layer is selected to provide antiferromagnetic coupling between the first and second ferromagnetic layers, a magnetic field source for biasing the directions of magnetization of the first and second layers of ferromagnetic material in directions approximately 90° with respect to each other, a first lead connected to a first end of the sensor stack, and a second lead connected to a second end of the sensor stack.

In another aspect, the invention encompasses disc drives comprising a motor for rotating a magnetic storage disc, an arm for positioning a read head adjacent to the disc, and wherein the read head includes a sensor stack including first and second layers of ferromagnetic material, a first nano-oxide layer positioned adjacent to the first layer of ferromagnetic material, and a layer of non-magnetic material positioned between the first and second layers of ferromagnetic material, wherein the thickness of the non-magnetic layer is selected to provide antiferromagnetic coupling between the first and second ferromagnetic layers, a magnetic field source for biasing the directions of magnetization of the first and second layers of ferromagnetic material in directions approximately 90° with respect to each other, a first lead connected to a first end of the sensor stack, and a second lead connected to a second end of the sensor stack.

DETAILED DESCRIPTION OF THE INVENTION

Figure 1:
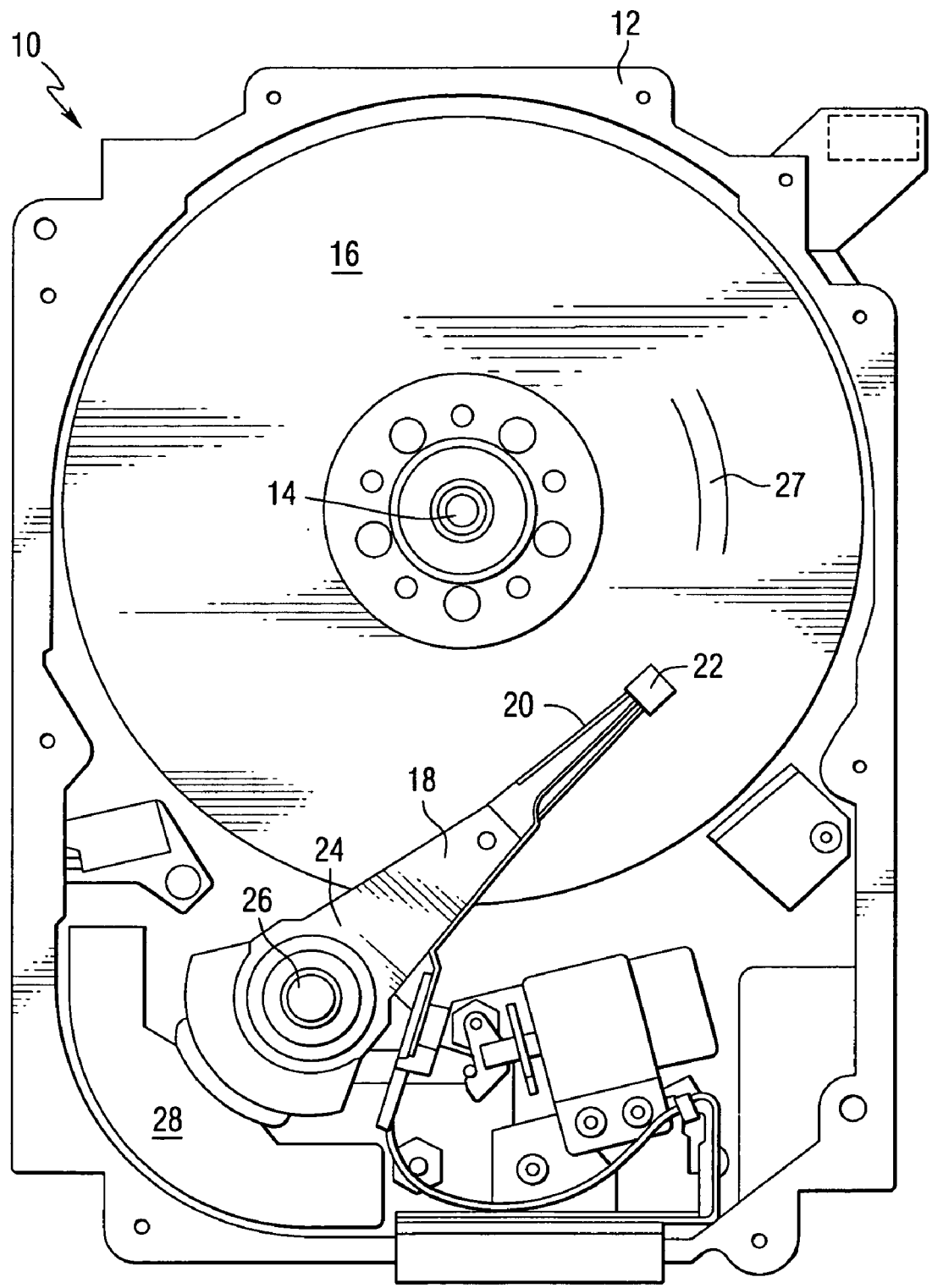
FIG. 1 is a pictorial view of a disc drive that can include the sensors of this invention.

Referring to the drawings, FIG. 1 is a pictorial representation of a disc drive 10 that can utilize a transducer in accordance with this invention. The disc drive 10 includes a housing 12 (with the upper portion removed and the lower portion visible in this view) sized and configured to contain the various components of the disc drive. The disc drive 10 includes a spindle motor 14 for rotating at least one storage medium 16, which may be a ferroelectric recording medium, within the housing 12. At least one arm 18 is contained within the housing 12, with each arm 18 having a first end 20 with a recording head or slider 22, and a second end 24 pivotally mounted on a shaft by a bearing 26. An actuator motor 28 is located at the arm's second end 24 for pivoting the arm 18 to position the recording head 22 over a desired sector or track 27 of the disc 16. The actuator motor 28 is regulated by a controller, which is not shown in this view and is well-known in the art.

Figure 2:
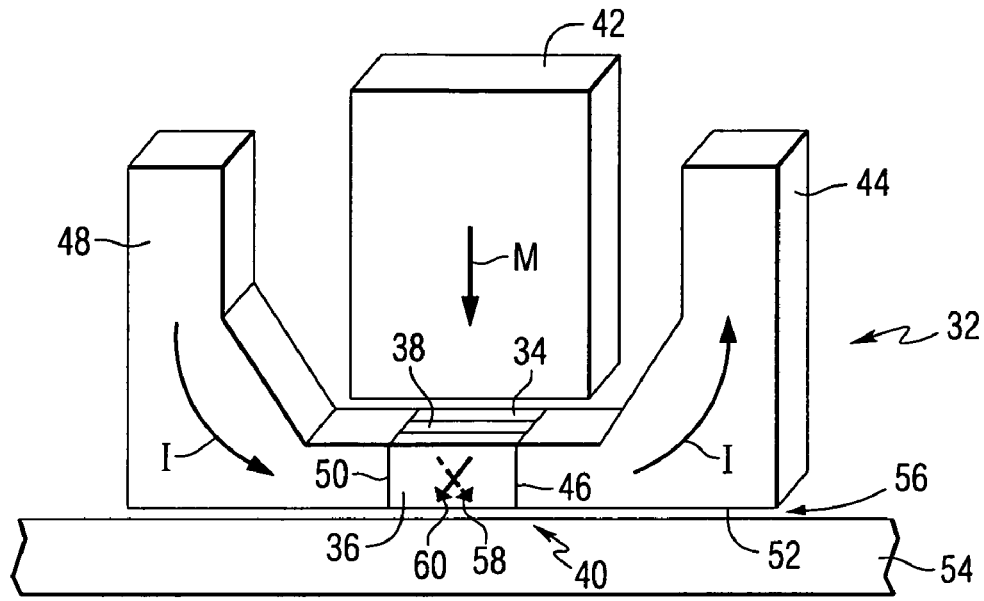
FIG. 2 is an isometric view of a trilayer CIP sensor constructed in accordance with this invention.

FIG. 2 is an isometric view of a trilayer CIP sensor 32 constructed in accordance with this invention. The sensor includes a first ferromagnetic layer 34 and a second ferromagnetic layer 36, positioned on opposite sides of a non-magnetic layer 38 to form a trilayer stack 40. The thickness of the non-magnetic layer is selected to produce antiferromagnetic coupling between the first and second ferromagnetic layers. A permanent magnet 42 is positioned adjacent to one side of the stack to bias the directions of magnetization of the first and second layers of ferromagnetic material in directions approximately 90° with respect to each other. The direction of magnetization of the permanent magnet is shown by arrow M. A first conductive lead 44 is electrically connected to a first end 46 of the trilayer stack and a second conductive lead 48 is electrically connected to a second end 50 of the trilayer stack. When the sensor is used as a read element in a disc drive, the sensor can be positioned adjacent to an air bearing surface 52 of a read head. The read head can be separated from a magnetic disc 54 by an air bearing 56. Arrows 58 and 60 show the relative orientations of the magnetization of the ferromagnetic layers. Magnetic fields produced by magnetic domains in the disc can affect the direction of magnetization of the ferromagnetic layers in the sensor, thereby changing the resistance of the sensor. This change in resistance causes a change in voltage across the sensor when a current I is passed through the sensor. This voltage can be used as an indication of the magnetization of the domains in the disc. The layers of the sensor stack are in planes that lie substantially perpendicular to the air bearing surface and the current passes through the sensor in a direction parallel to the planes of the layers.

Figure 3:
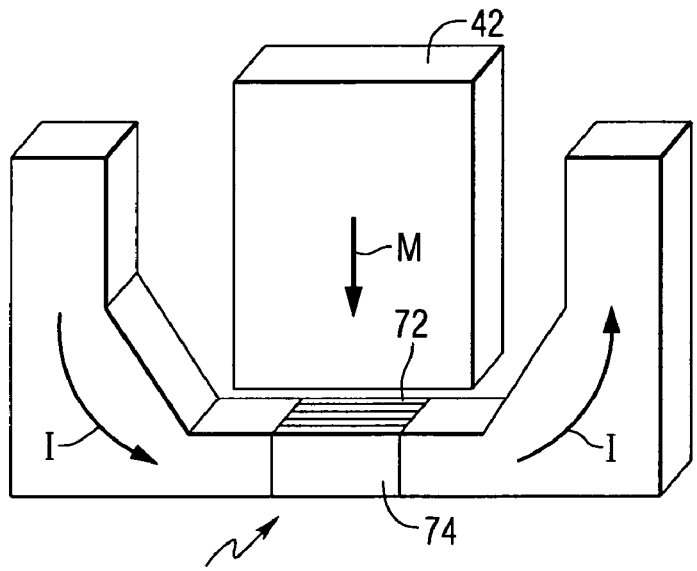
FIG. 3 is an isometric view of a trilayer CIP sensor with nano-oxide layers (NOLs) constructed in accordance with this invention.

FIG. 3 is an isometric view of a trilayer CIP sensor 70 that includes the elements of FIG. 2 and further includes nano-oxide layers (NOLs) 72 and 74 positioned on opposite sides of the trilayer stack. The nano-oxide layers act as specular reflectors for electrons flowing through the stack.

Figure 4:
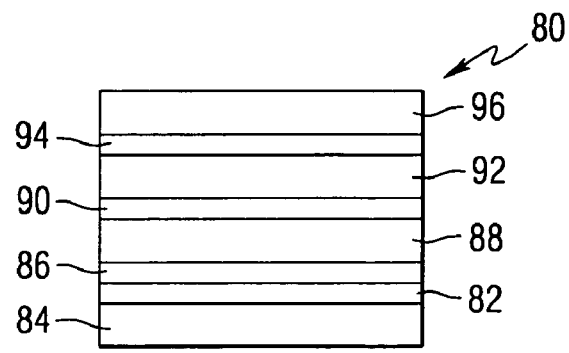
FIG. 4 is a plan view of a sensor stack.

FIG. 4 is a plan view of another sensor stack 80 constructed in accordance with the invention. The sensor can be fabricated by depositing a seed layer 82 on a substrate 84, creating a first nano-oxide layer 86 on the seed layer, depositing a first ferromagnetic layer 88 on the nano-oxide layer, depositing a layer of non-magnetic material 90 on the ferromagnetic layer, depositing a second layer of ferromagnetic material 92 on the layer of non-magnetic material, creating a second nano-oxide layer 94 on the second layer of ferromagnetic material, and depositing a cap layer 96 on the second nano-oxide layer. Various materials can be used to construct the layers. For example, the seed layer can be Ni12Fe48Cr40, the nano-oxides layer can be formed by oxidizing a layer of Al, Fe80Co20 or Co90Fe10, the ferromagnetic layers can be Fe, Co, Ni or an alloy of these such as Co90Fe10, the non-magnetic layer can be Cu, Au, Ag or Cr, and the cap layer can be $Al_2O_3$, Ta or some other high resistivity or insulating material.

Figure 5:
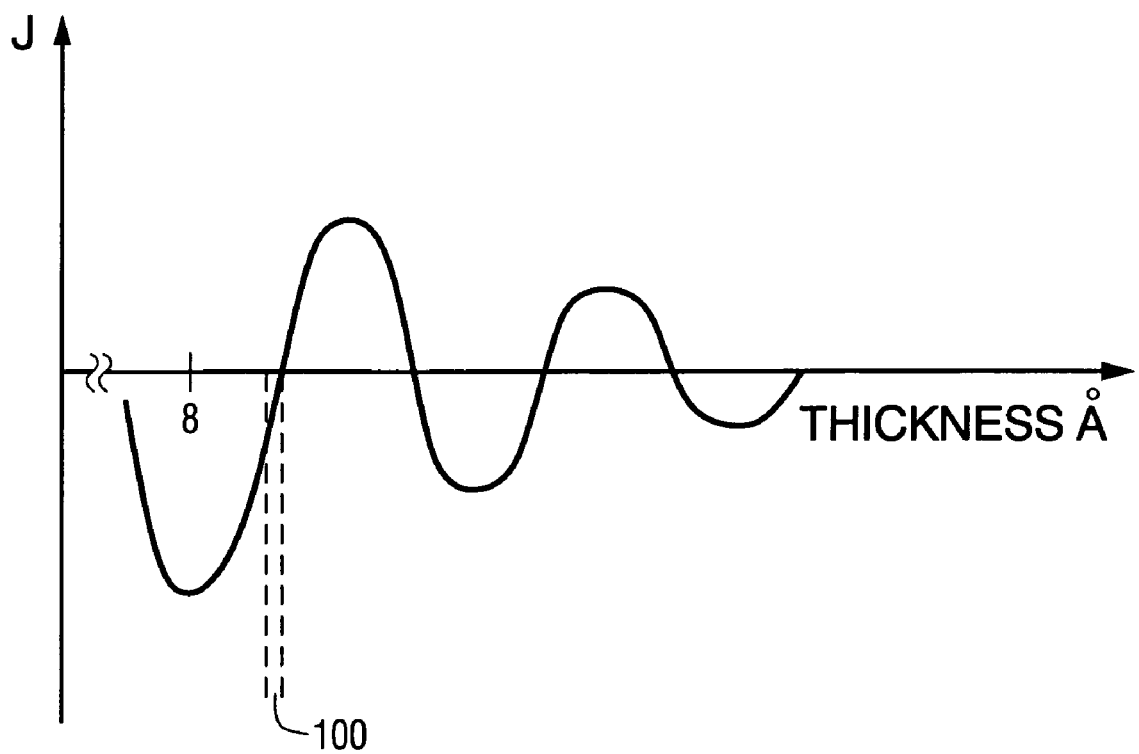
FIG. 5 is a graph showing the magnetic coupling strength between the ferromagnetic layers of the sensor stack versus interlayer thickness.

FIG. 5 is a graph of the interlayer coupling J between the ferromagnetic layers of the sensor stack versus the thickness of the non-magnetic layer. A positive value for the transfer function represents ferromagnetic coupling, and a negative value for the transfer function represents antiferromagnetic coupling. The thickness of the non-magnetic layer can be chosen to provide coupling in a region which provides maximum sensitivity of the sensor by decreasing the saturation field while maintaining AFM coupling between the first and second ferromagnetic layers, for example region 100 in FIG. 5. The saturation field is proportional to J.

To demonstrate the invention, two example sensors were analyzed. The first example used a metal oxide as the nano-oxide layer on both the bottom and top of the sensor stack, and the second example used the metal oxide on only the bottom of the sensor stack.

Different materials have been investigated for use as the NOL material. In one example, referred to as a "Top and Bottom" configuration, the stack using a Cr oxide NOL is: NiFeCr60 Å/Cr10 Å/RPO10010/CoFe15 Å/Cu19 Å/CoFe15 Å/Cr10 Å/RPO10010/Ta50 Å, where RPO10010 represents a 10 second remote plasma oxidation (RPO) using 10 mT of oxygen. In this example, NiFeCr is the seed layer, the nano-oxide is CrO (formed by oxidation of the Cr layer), the ferromagnetic layers are CoFe, the non-magnetic layer is Cu, and the cap layer is Ta. The RPO can be performed by striking an oxygen plasma over a sputtering target (only oxygen in the chamber), but keeping the shutter closed so that the shutter is between the plasma and the wafer.

Because the oxide layer on the bottom may have an effect on the giant magnetoresistance (GMR) by altering the texture of the CoFe/Cu/CoFe trilayer, a second set of samples was deposited keeping the bottom oxide layer as a CoFeO layer. The second set of samples are referred to as "Top Only" samples. The "Top Only" samples kept the bottom layer as CoFeO and the top layer was varied. In one example the "Top Only" stack with a Cr oxide NOL is: NiFeCr60 Å/CoFe10 Å/RPO10010/CoFe15 Å/Cu19 Å/CoFe15 Å/Cr10 Å/RPO10010/Ta50 Å

Figure 6:
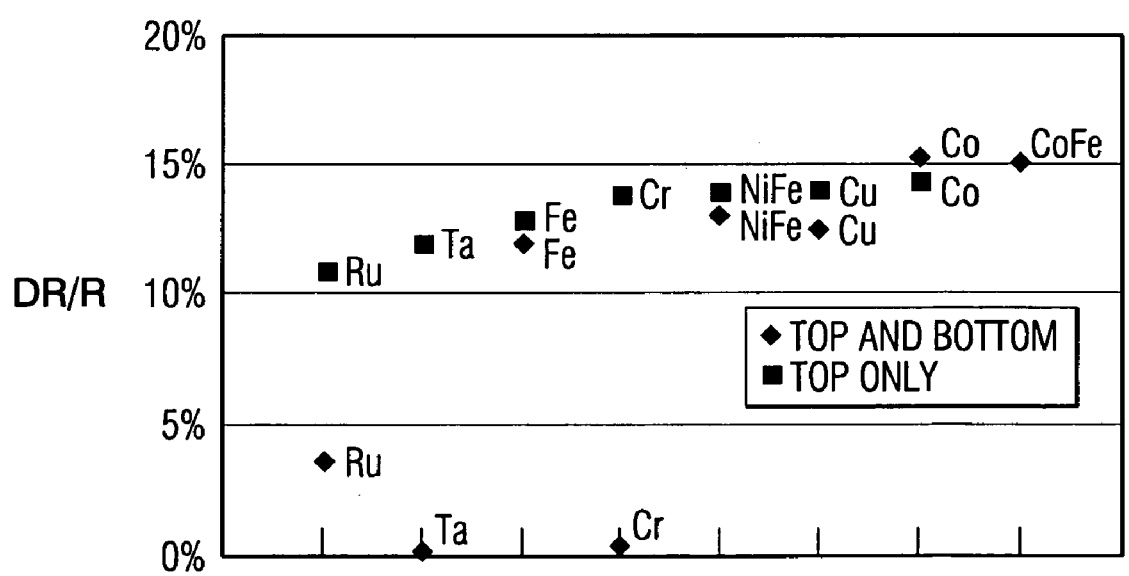
FIG. 6 is a graph showing DR/R for a second AFM peak trilayer using various metal oxides for the nano-oxide layers.
Figure 7:
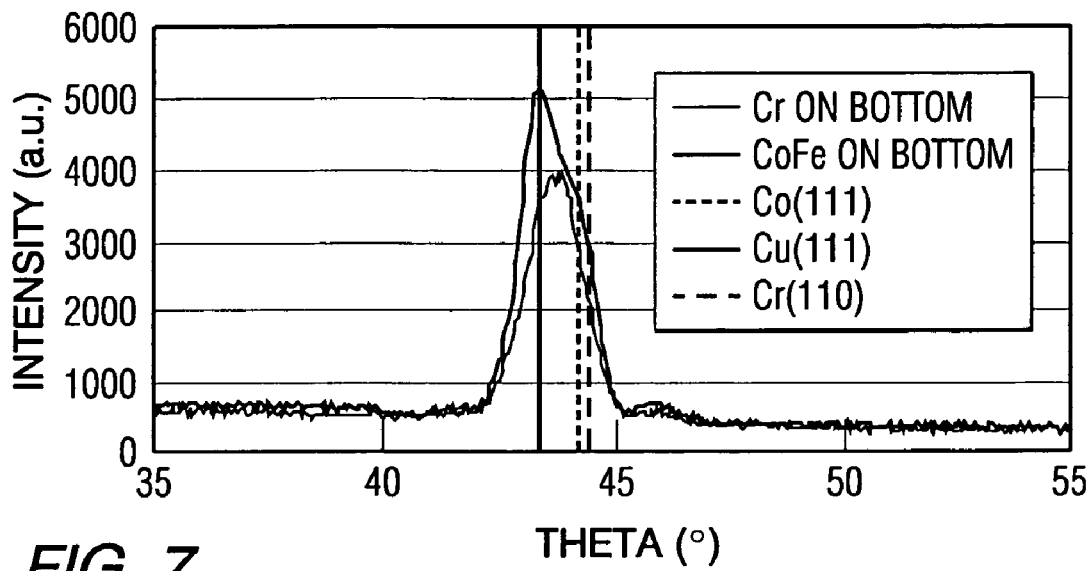
FIG. 7 is a graph showing X-ray diffraction (XRD) traces of sensors including the two Cr NOL samples shown in FIG. 4.

The data for several different materials is shown in FIG. 6. CoFe material provided the largest DR/R, with Co being a close second. It can also be seen that some materials, such as Ru, Ta and Cr, did not work well when they were used on the bottom. This indirectly verified that the bottom oxide has an effect on the growth of the subsequent layers. FIG. 7 shows an X-ray diffraction (XRD) trace for the two Cr NOL samples used to produced the data in FIG. 6. It can be seen that the peak is shifted away from the Cu peak and toward the Cr peak, and/or the Cu portion of the peak is lowered in intensity by the Cr layer on the bottom. There was much less material dependence for the "Top Only" samples than for the "Top and Bottom" samples.

Figure 8:
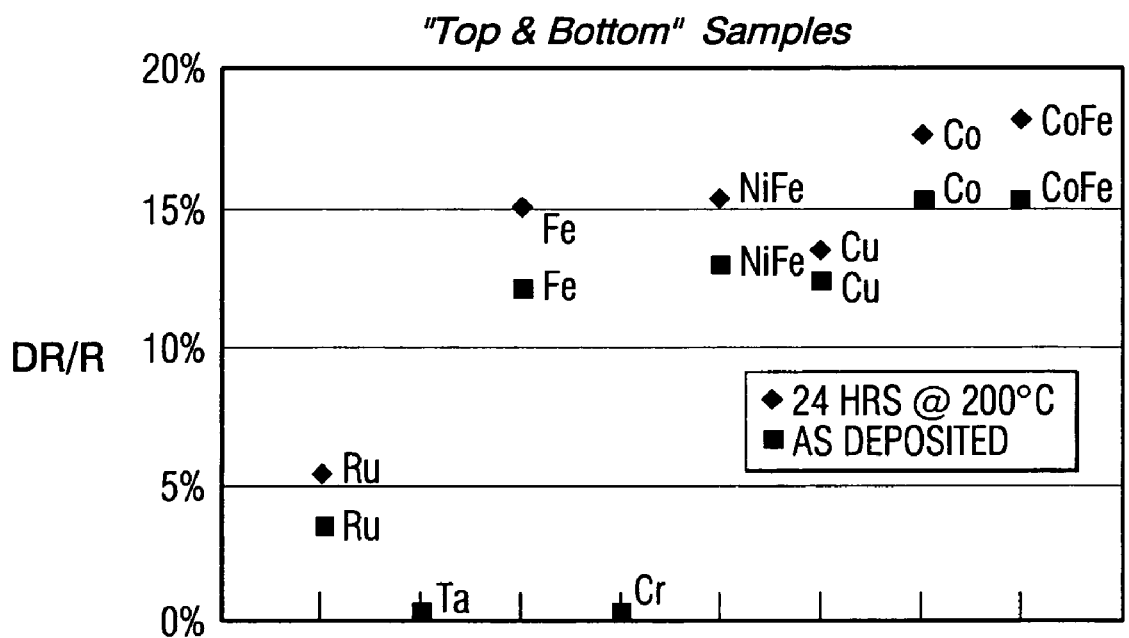
FIGS. 8 and 9 are graphs showing DR/R for second AFM peak trilayers using various metal oxides for the nano-oxide layers after a 24 hour anneal at 200° C.
Figure 9:
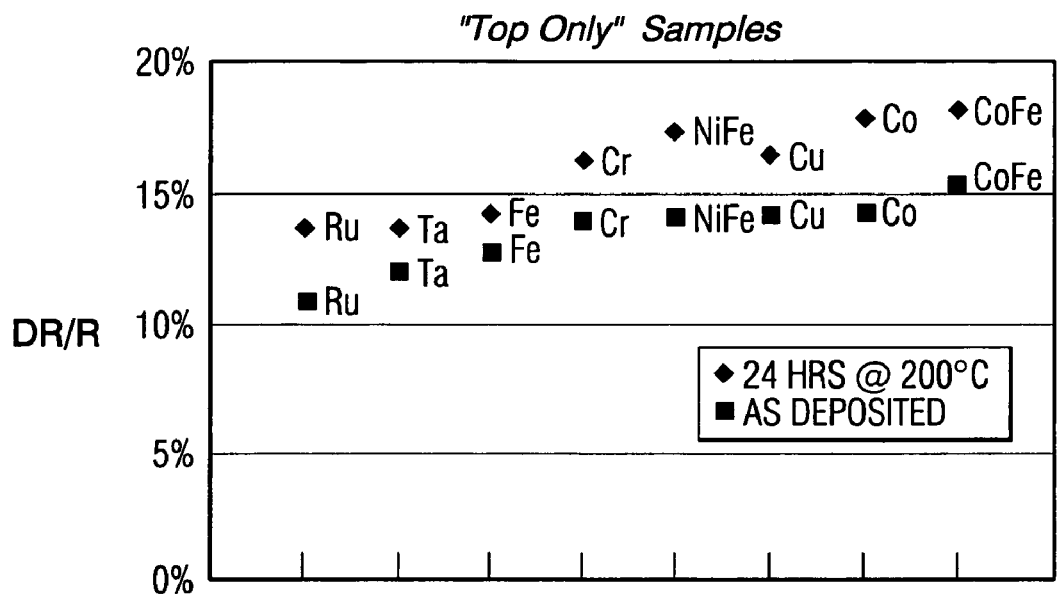

FIGS. 8 and 9 show the DR/R for a second AFM peak trilayer using various metal oxides for the specular scattering layers. For the "Top and Bottom" samples, the metal oxide was used both on the top and bottom of the trilayer. For the "Top Only" samples CoFeO was used on the bottom and the metal oxide (as labeled) was used on the top. The "Top and Bottom" samples are shown in FIG. 8 and the "Top Only" samples are shown in FIG. 9. The samples were annealed to verify that they were thermally stable and that the oxygen is not diffusing throughout the film stack. FIGS. 8 and 9 show a comparison of the DR/R before and after a 24 hour, 200° C. anneal. The anneal increased the DR/R for almost every sample and did not decrease the DR/R for any of the samples. The CoFe NOL on both the top and bottom gave the largest DR/R.

Figure 10:
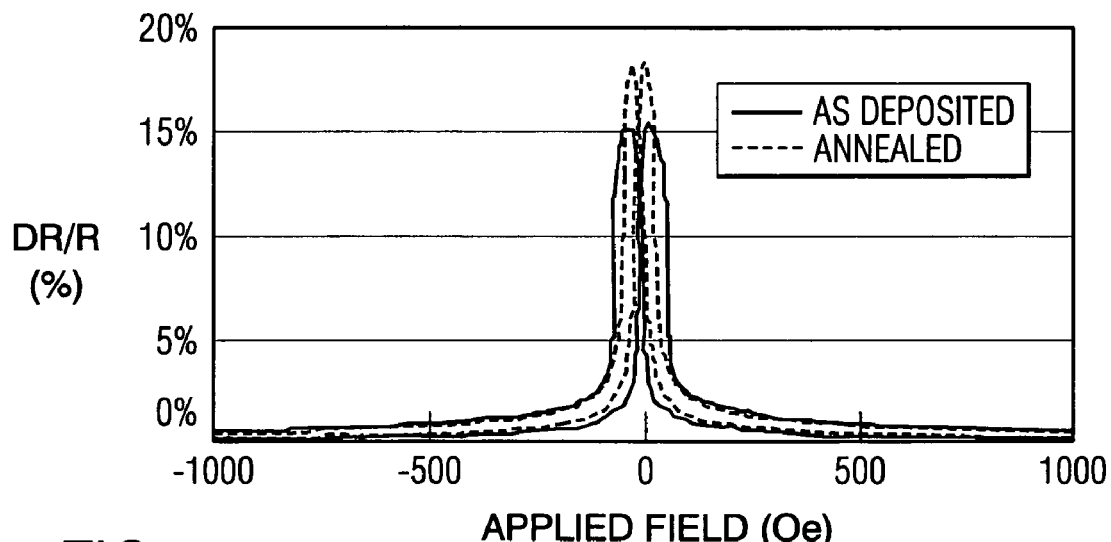
FIGS. 10 and 11 are graphs showing the DR/R and DR/sq. transfer curves before and after a 24 hour 200° C. anneal.
Figure 11:
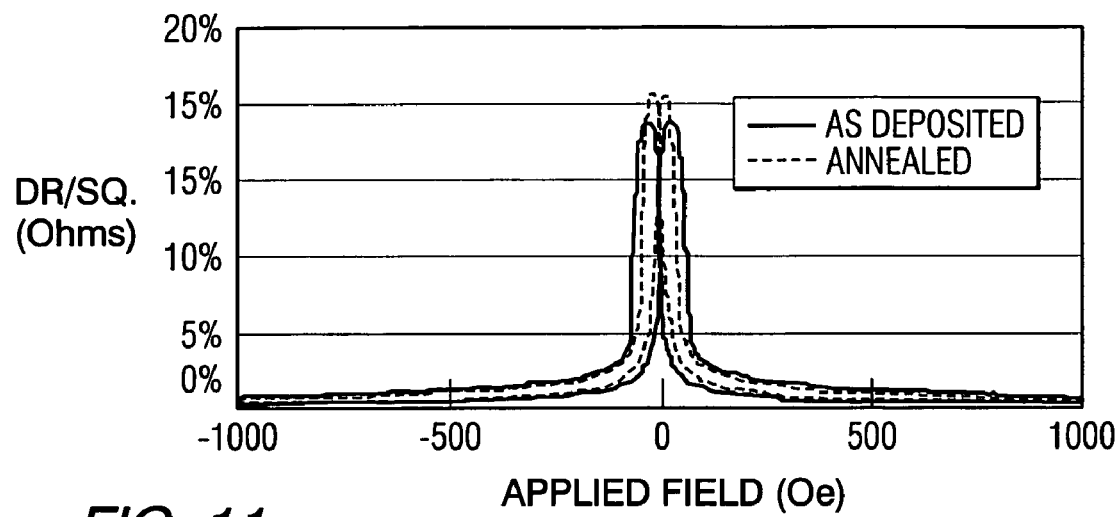

FIGS. 10 and 11 show the DR/R and DR/sq. transfer curves for the CoFe "Top and Bottom" sample for both the as-deposited and annealed samples before and after the 24 hour 200° C. anneal. As is shown in FIG. 10, both DR/R and DR/sq. increase. In addition, it can be seen from this graph that the anneal also improves the magnetics by decreasing the hysteresis in the transfer curve. The anneal results show that the NOL trilayers may be thermally stable.

To increase the DR/R ratio, the number of FM layers can be increased. The number of CoFe layers was varied in several samples to determine the enhancement due to the NOL. It would be expected for a given specularity from the NOL that the enhancement would be larger for the thinner sensors (fewer CoFe layers). The number of CoFe layers refers to the number of free CoFe layers. For example, a two CoFe layer stack would be:

NiFeCr60 Å/CoFe10 Å/RPO10010/CoFe15 Å/Cu19 Å/CoFe20 Å/RPO10010/Ta 50 Å, and a five CoFe layer stack would be:

NiFeCr60 Å/CoFe10 Å/RPO10010/CoFe15 Å/Cu19 Å/CoFe15 Å/Cu19 Å/CoFe15 Å/Cu19 Å/CoFe15 Å/Cu19 Å/CoFe20 Å/RPO10010/Ta50 Å.

Figure 12:
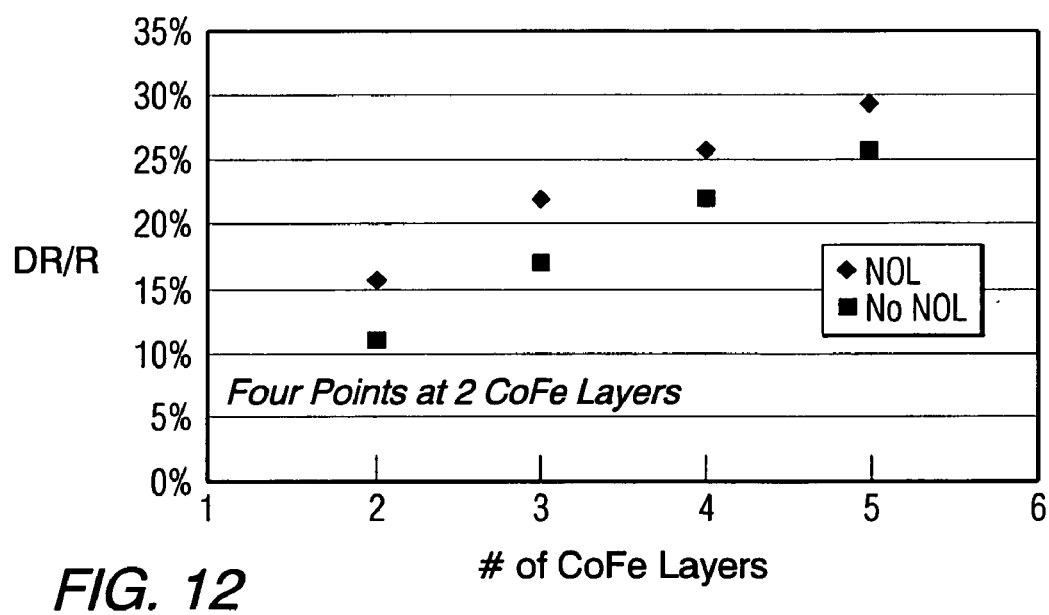
FIGS. 12 and 13 are graphs showing DR/R and DR/sq. for CoFe/Cu/CoFe sensors with and without NOLs and for various numbers of CoFe layers.
Figure 13:
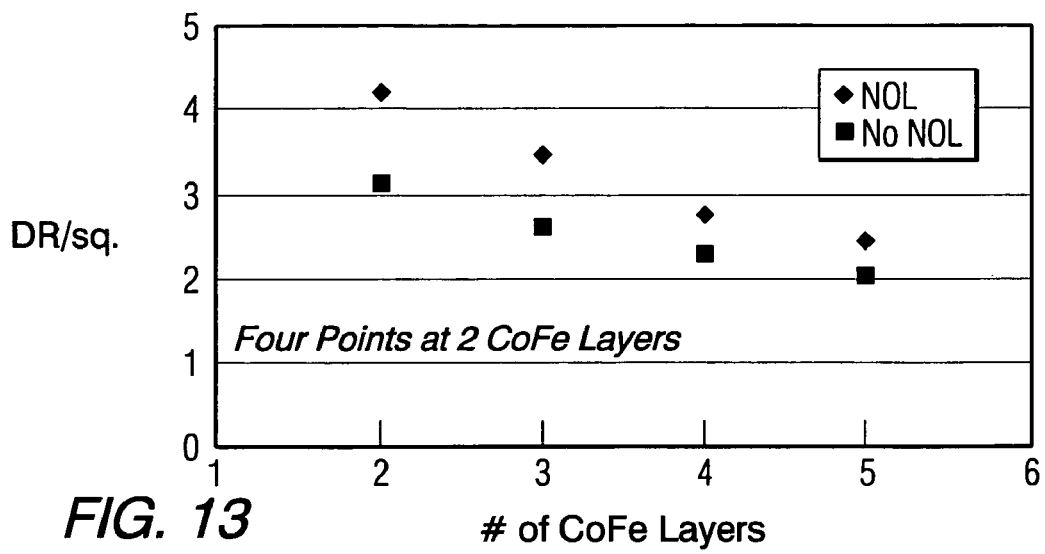
Figure 14:
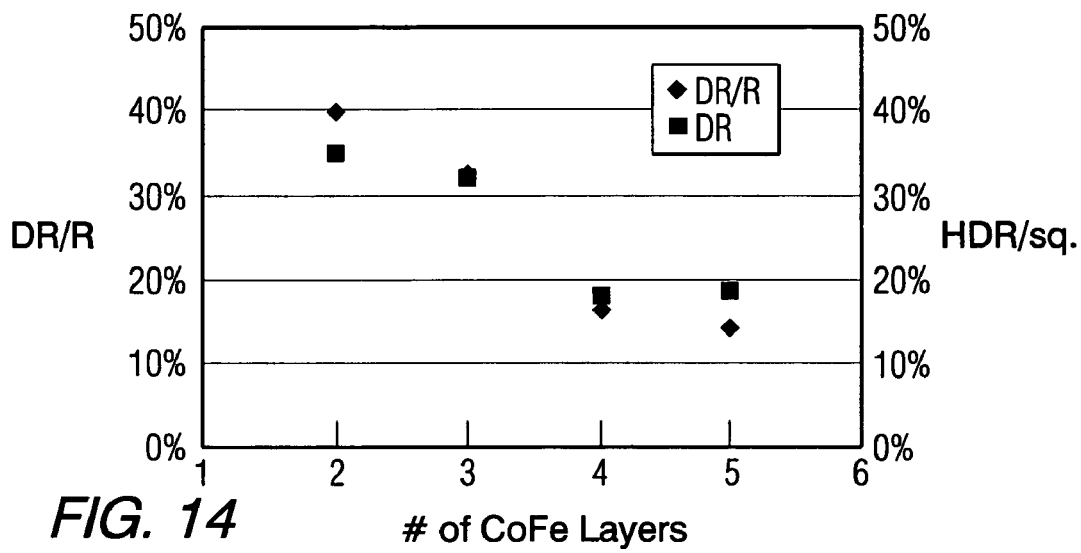
FIG. 14 is a graph showing the percent increase in DR/R and HDR/sq. due to the NOL for various numbers of CoFe layers.

FIGS. 12 and 13 show DR/R and DR/sq. for various numbers of CoFe free layers for sensors with and without NOLs. The percent increase in DR/R and DR/sq. from adding the NOL is shown in FIG. 14. It can be seen that the NOL increases the DR/R and DR/sq. more for the sensors with fewer CoFe layers, with a 40% increase in the DR/R for the two CoFe layer sensor. Without much optimization a DR/sq. of >4 Ω/sq. was achieved, which is better than that achieved in CIP spin valves.

Figure 15:
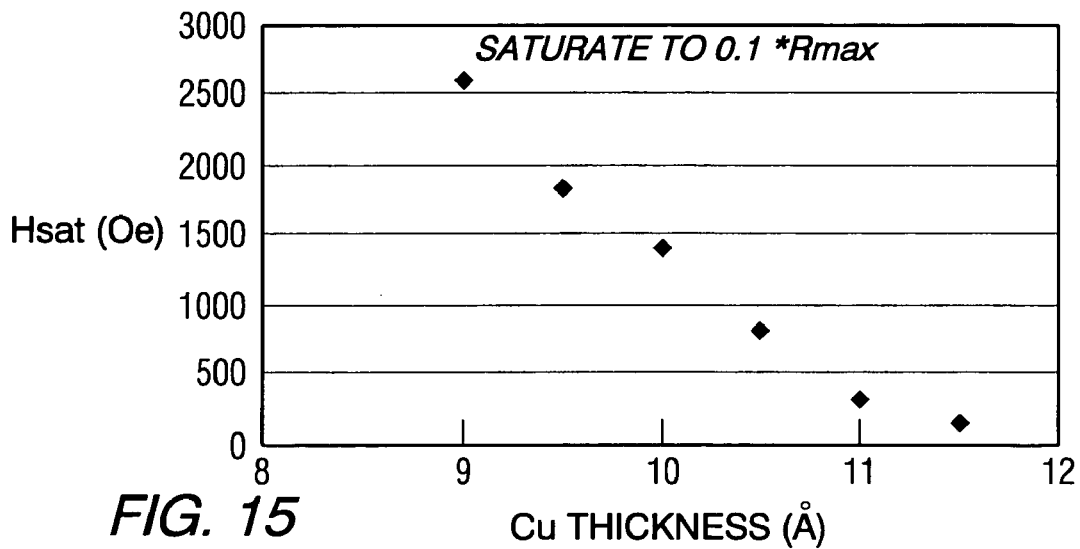
FIG. 15 is a graph showing Hsat versus Cu thickness.

FIG. 15 shows the saturation field versus the Cu thickness near the first AFM peak. For the multilayers that were previously investigated, the AFM peak was located at Cu 8 Å. However the saturation field of multilayers with a Cu layer of 8 Å is too large. This invention uses non-magnetic layer thicknesses that are off the peak to achieve a smaller saturation field. As compared to the multilayers, the trilayer structures of this invention have much smaller saturation fields. A decrease in saturation field is expected due to the increase in the ratio of magnetic layers to nonmagnetic layers (magnetostatic energy from an applied field to RKKY coupling energy).

Figure 16:
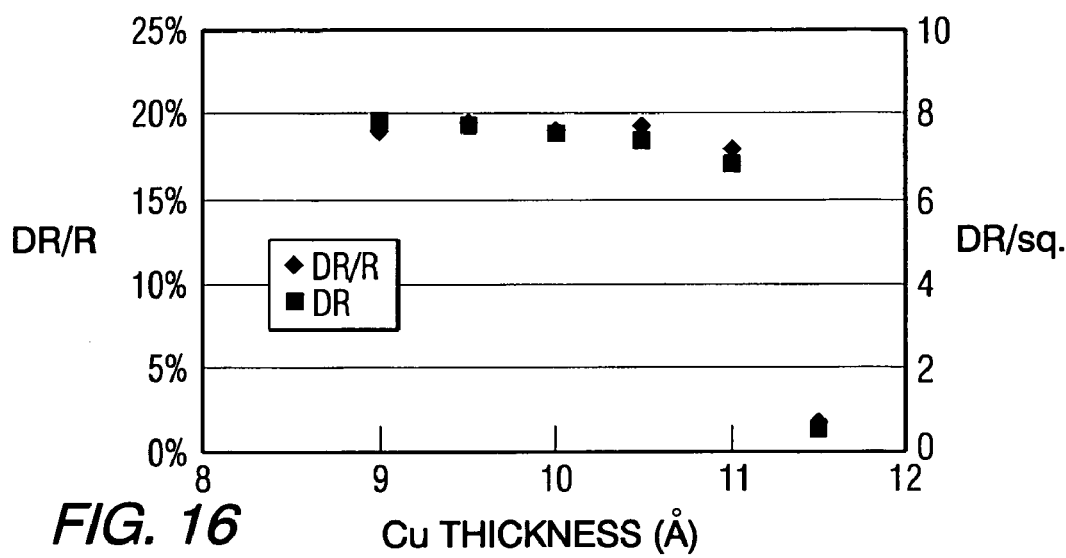
FIG. 16 is a graph showing DR/R and DR/sq. and saturation field (field to reduce resistance to 10% of the maximum resistance) versus interlayer Cu thickness near the first AFM RKKY peak.
Figure 17:
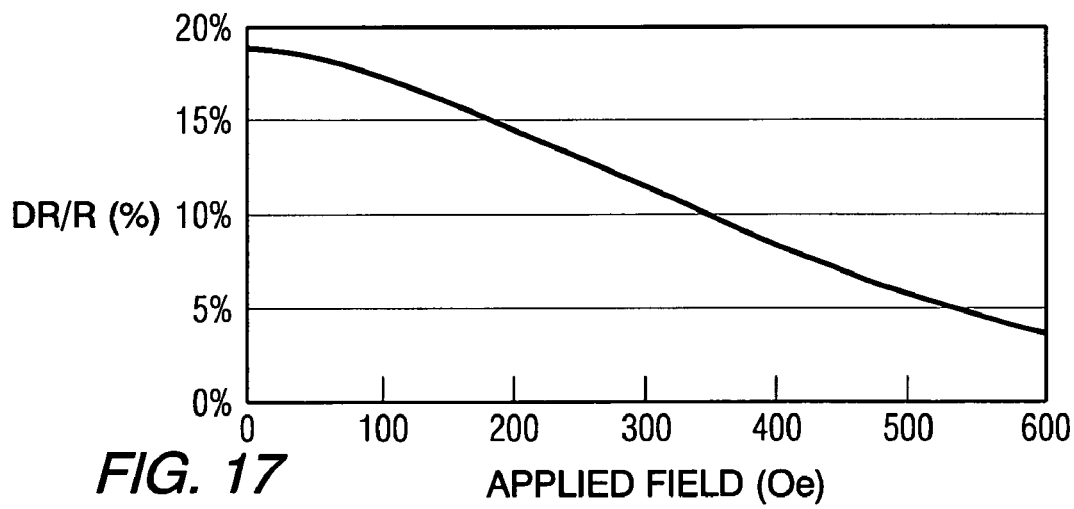
FIG. 17 is a graph showing one half of the transfer curve for a sensor including a 10.5 Å Cu interlayer, over the approximately linear range.

FIG. 16 shows the DR/R versus the Cu thickness. There is a large drop in GMR in going from 11 to 11.5 Å. A Cu thickness of 10.5 Å provides a sufficient sensitivity, considering the fields from the media. FIG. 17 shows a partial transfer curve for a Cu layer thickness of 10.5 Å. It can be seen that a ±250 Oe field would take the sensor through its entire linear range. The sensitivity will decrease when the sensor is patterned, but this will be relatively independent of the Cu thickness and if the demagnetization field dominates, then the Cu thickness isn't as important, unless the AFM magnetostatic coupling is to be balanced with a slight FM RKKY coupling. The AFM magnetostatic coupling can be balanced with the FM RKKY coupling to decrease the saturation field and make the sensors more sensitive.

Figure 18:
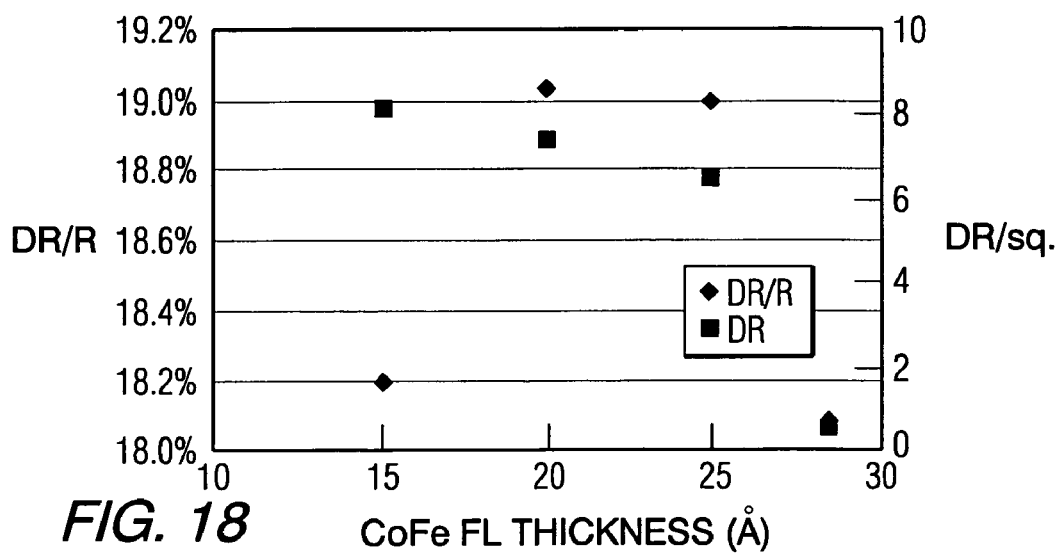
FIG. 18 is a graph showing DR/R and DR/sq. for sensors with various top CoFe layer thicknesses.
Figure 19:
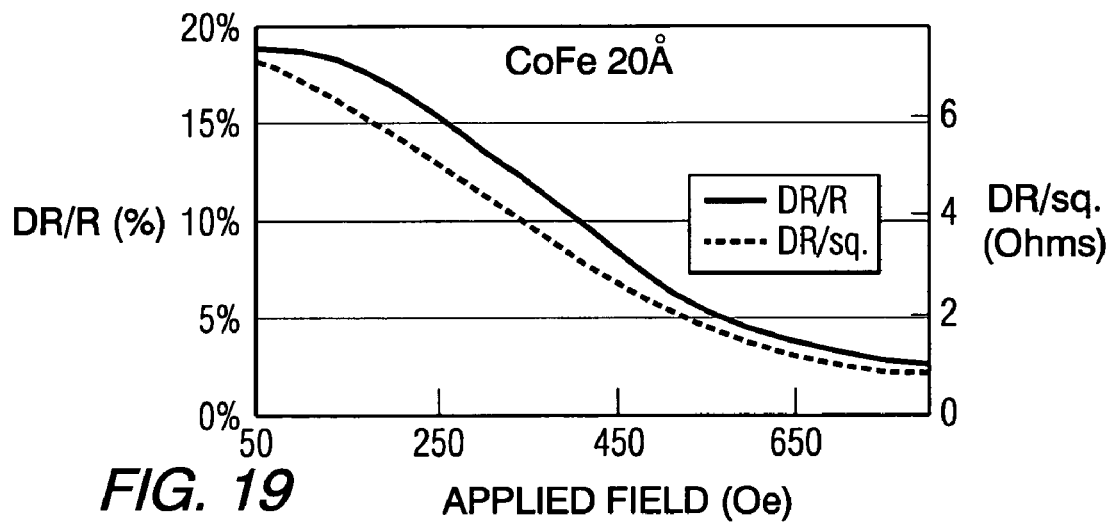
FIGS. 19 and 20 are graphs showing the transfer curves for sensors with CoFe layer thicknesses of 20 Å and 15 Å respectively.
Figure 20:
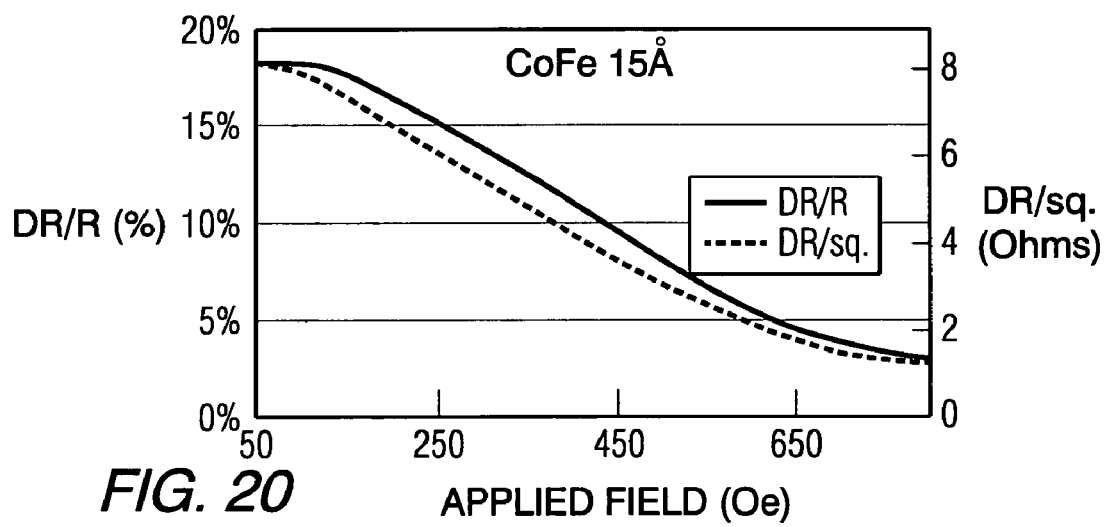

FIG. 18 shows that, depending on the parameters to be maximized, the optimum CoFe thickness is 15–20 Å. FIGS. 19 and 20 show the partial transfer curves for the CoFe 15 Å and CoFe 20 Å samples. The transfer curve shows considerable hysteresis. The data in FIGS. 19 and 20 are for sheet films with no biasing, and the transfer curves are taken from saturation in one direction to saturation in the other direction. This is the worst case for generating hysteresis.

Figure 21:
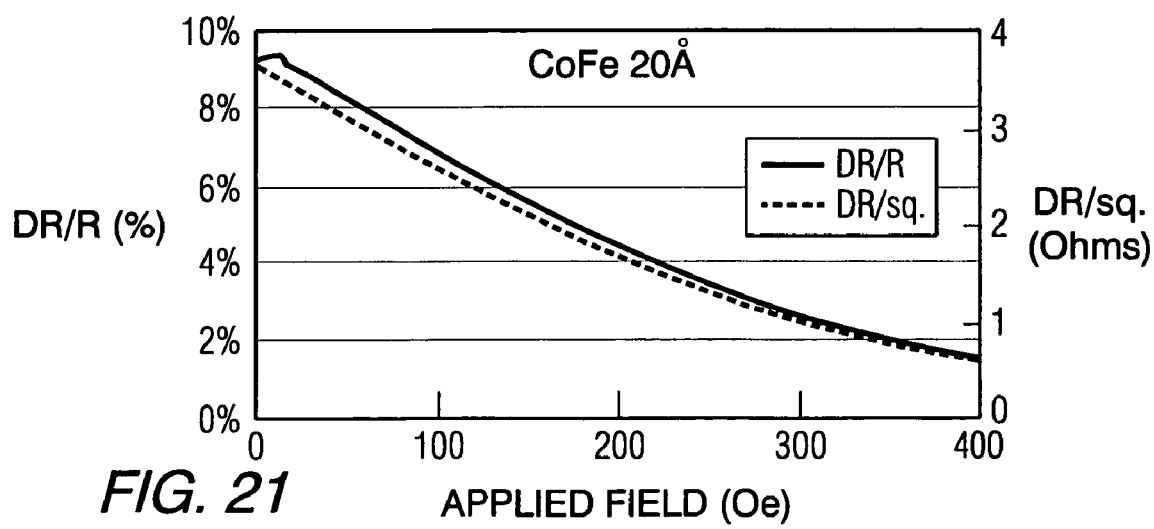
FIG. 21 is a graph showing a transfer curve for sensors with hysteresis reduced by removing the bottom CoFeO layer.
Figure 22:
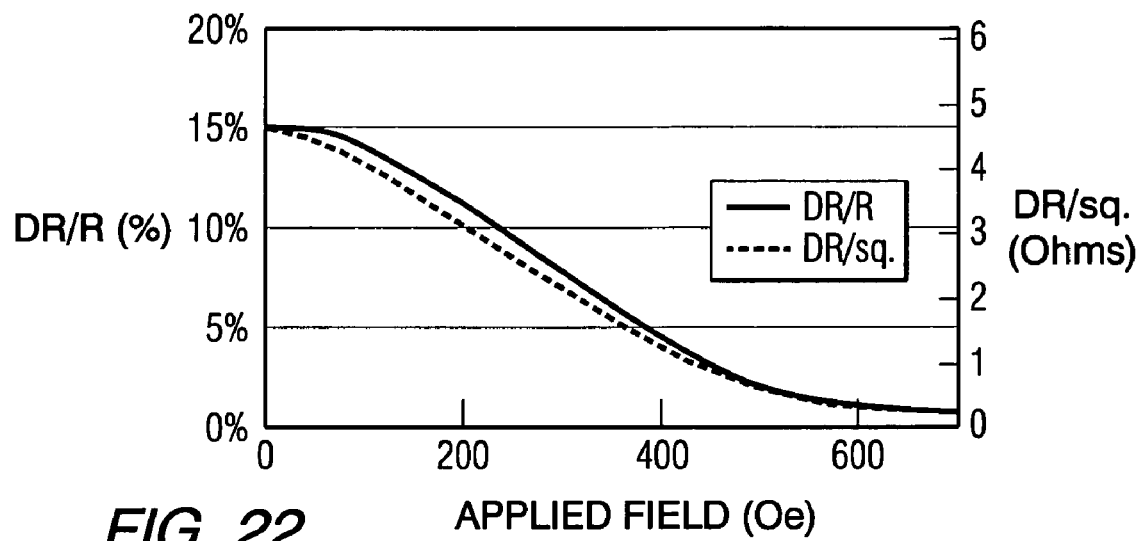
FIG. 22 is a graph showing a transfer curve for sensors with hysteresis reduced by incorporating NiFe in the bottom and the top layers.
Figure 23:
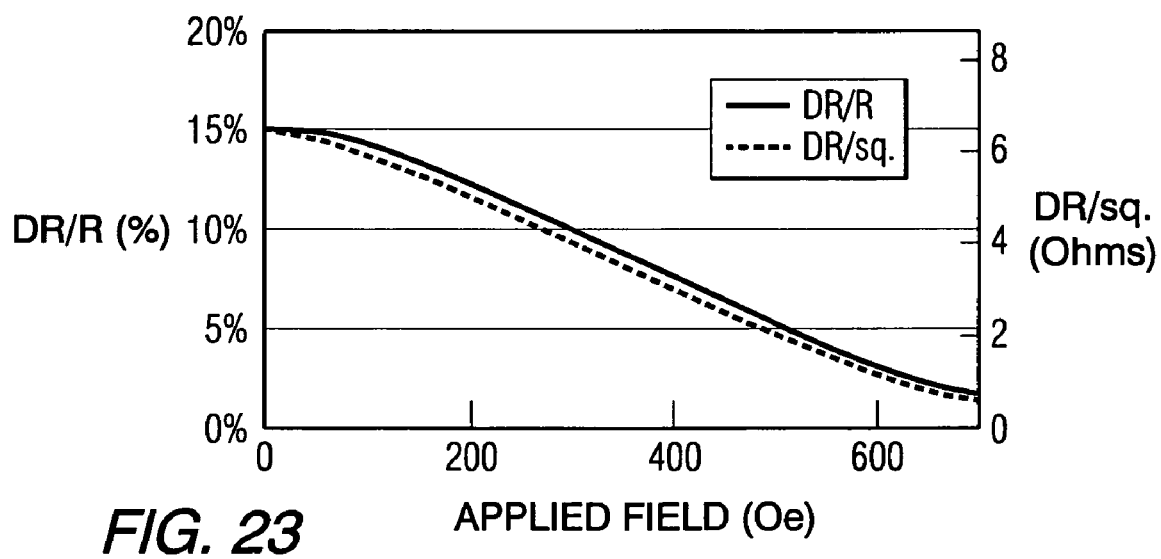
FIG. 23 is a graph showing a transfer curve for sensors with hysteresis reduced by incorporating NiFe in the bottom layer only.

FIGS. 21, 22 and 23 show the transfer curve for samples with reduced hysteresis. To obtain the data in FIG. 21, the bottom CoFeO layer was removed. In FIG. 22, NiFe was incorporated into the bottom and the top layers. In FIG. 23, NiFe was incorporated into the bottom layer only.

Two modifications were tried to reduce the hysteresis in the transfer curve. First, the bottom oxide layer was removed. FIG. 21 shows the transfer curve for this film stack. The hysteresis was reduced, but so were the DR/R and DR. Next, NiFe was incorporated into the film stack. Many different locations and thicknesses were investigated. Two examples of interest were when NiFe was used in both layers and only in the bottom layer. FIGS. 22 and 23 show the transfer curves for these samples. The hysteresis was reduced without reducing the DR/R or DR as much as when the bottom CoFeO layer was removed.

The three samples used to obtain the data shown in FIGS. 21, 22 and 23 are:

NiFeCr60 Å/CoFe15 Å/Cu10.5 Å/CoFe20 Å/RPO10010/ Ta50 Å;

NiFeCr50 Å/CoFe10 Å/RPO10020/NiFe10 Å/CoFe10 Å/Cu10.5 Å/CoFe10 Å/NiFe10 Å/CoFe10 Å/RPO1002/ Ta50 Å; and NiFeCr50 Å/CoFe10 Å/RPO10020/NiFe10 Å/CoFe10 Å/Cu010.5 Å/CoFe15 Å/RPO10020/Ta50 Å.

The NOL combined with the near first AFM peak Cu thickness worked very well. Without much optimization, a DR/R of 20% was achieved, and a very large DR/sq. of 8 Ω/sq. was achieved. With this large increase in DR and the potential for increasing the $I_b$, these sensors could have a much higher voltage amplitude than CIP-SVs.

Figure 24:
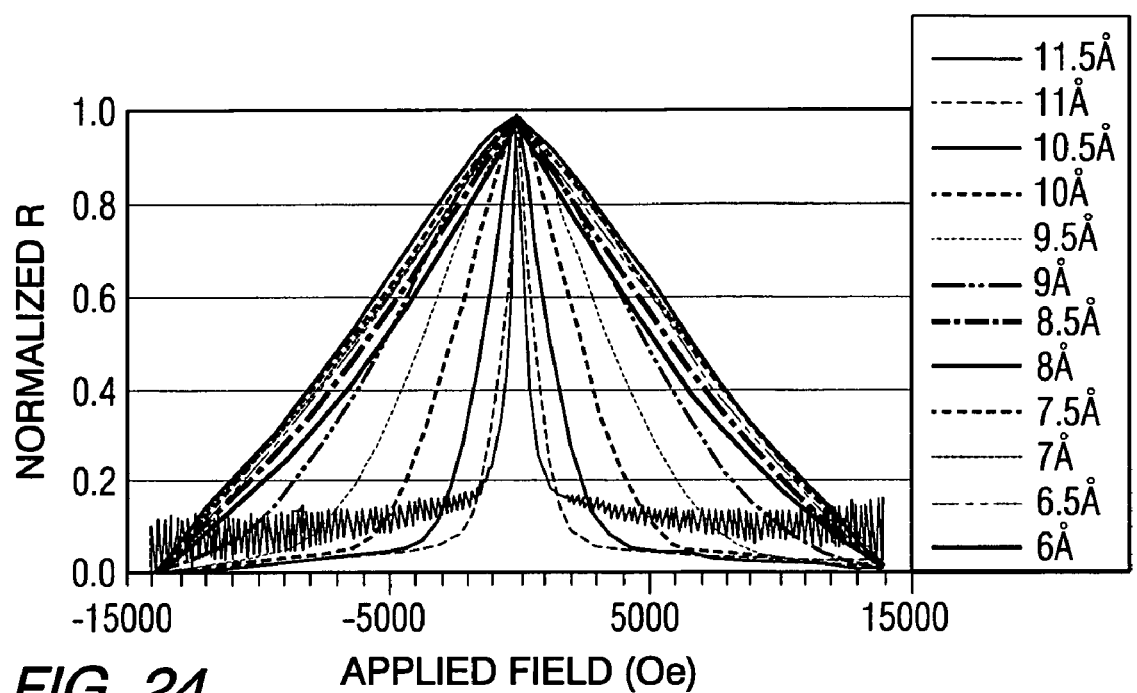
FIG. 24 is a graph showing transfer curves for a GMR multilayer with varying Cu thickness.
Figure 25:
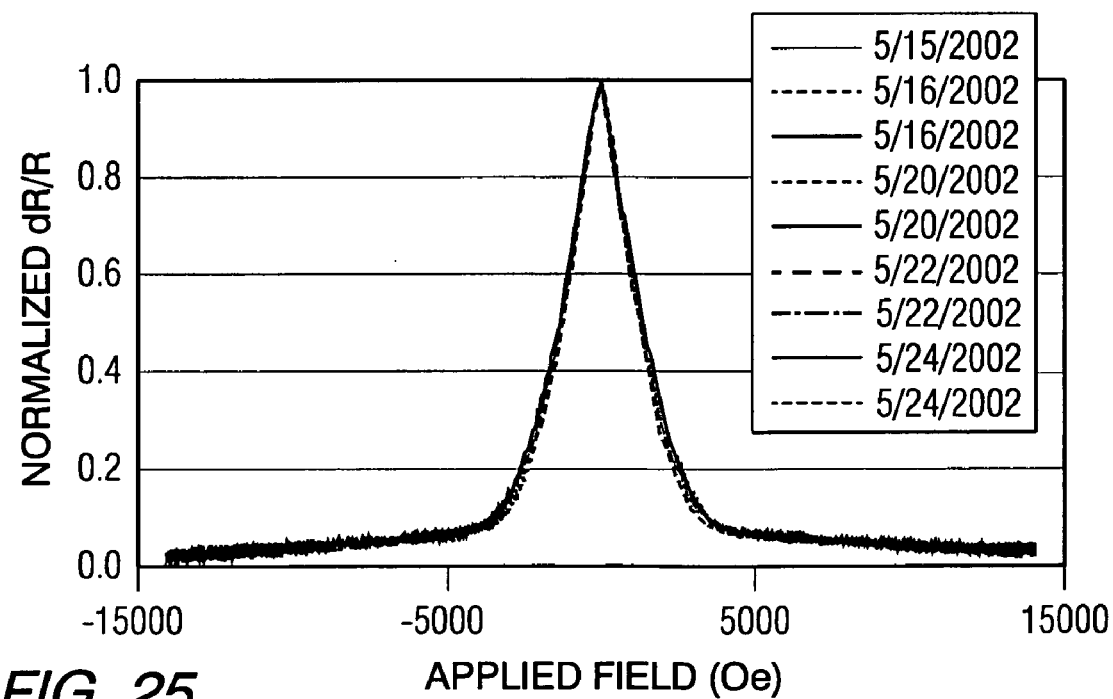
FIG. 25 is a graph showing transfer curves for multiple Cu 10.5 Å samples deposited over a period of 10 days.

Experiments were conducted to demonstrate the ability to control the Cu thickness. FIG. 24 is a graph showing transfer curves for a GMR multilayer with varying Cu thickness. FIG. 24 shows how the transfer curve changes significantly with a 0.5 Å change in the Cu thickness. The Cu 10.5 Å sample was then repeated multiple times in a day and over a period of 10 days and the results are shown in FIG. 25. The data of FIG. 25 shows. that the Cu thickness can be controlled precisely enough to make the thin Cu concept viable.

Table No. 1 compares parameters for a CIP trilayer sensor of this invention and a standard CIP spin-valve.

TABLE NO. 1

| Structure | DR/sq. (Ω/sq.) | DR/R | Rsheet (Ω/sq.) |
| --- | --- | --- | --- |
| CIP Trilayer | 22 | 27 | ~82 |
| CIP Spin-Valve | 3–4 | 15–20 | ~20 |

The large DR/R and DR/sq. in the CIP sensor that produced the results in Table No. 1 were achieved by using: a thin Cu spacer layer to reduce shunting, thin seedlayers to reduce shunting, an insulating cap layer to reduce shunting, dual NOLs to increase specular scattering, and thin FM layers to reduce shunting. The CIP sensors of this invention can include a nonmagnetic layer having a thickness in the range of 5 to 12 Å.

This combination of features takes advantage of the fact that Rsheet vs. thickness is highly non-linear for a layer thickness much less than the mean free path (MFP), which greatly enhances the magnetoresistance. When in a low resistance (ferromagnetic state), the electrons freely move between the two ferromagnetic layers and the non-magnetic layer. When in the high resistance (antiferromagnetic state), the electrons can only freely move between one ferromagnetic layer and the non-magnetic layer. Once the electrons enter the second ferromagnetic layer, they are quickly scattered.

Several examples have been prepared. A first trilayer CIP sensor (sample 1) with nano-oxide layers had the structure: Sputter etch/NiFeCr60 Å/CoFe10 Å/RPO10010/CoFe15 Å/Cu19 Å/CoFe20 Å/RPO10010/Ta50 Å.

The first sensor had DR/sq. ~4.2 Ω/sq.; DR/R ~15.5%; and Rsheet ~27 Ω/sq.

A second trilayer CIP sensor (sample 2) with nano-oxide layers and a thin Cu nonmagnetic layer had the structure: Sputter etch/NiFeCr60 Å/CoFe10 Å/RPO10010/ CoFe15 Å/Cu10.5 Å/CoFe15 Å/RPO10010/Ta50 Å.

The second sensor had DR/sq. ~8.2 Ω/sq.; DR/R ~18.2%; and Rsheet ~45 Ω/sq.

A third trilayer CIP sensor (sample 3) with nano-oxide layers and a thinner seed layer and cap layer had the structure:
Sputter etch/NiFeCr20 Å/CoFe10 Å/RPO10020/CoFe15 Å/Cu10.5 Å/CoFe15 Å/RPO10020/Ta35 Å.

The third sensor had DR/sq. ~13.7 Ω/sq.; DR/R ~20.3%; and Rsheet ~67 Ω/sq.

A fourth trilayer CIP sensor (sample 4) with nano-oxide layers had the structure:
Sputter etch/NiFeCr20 Å/CoFe10 Å/RPO10020/CoFe15 Å/Cu10.5 Å/CoFe15 Å/Al5 Å/RPO10020/(Al15 Å/RPO10060)×3.

The fourth sensor had DR/sq. ~22 Ω/sq.; DR/R ~27%; and Rsheet ~82 Ω/sq.

Figure 26:
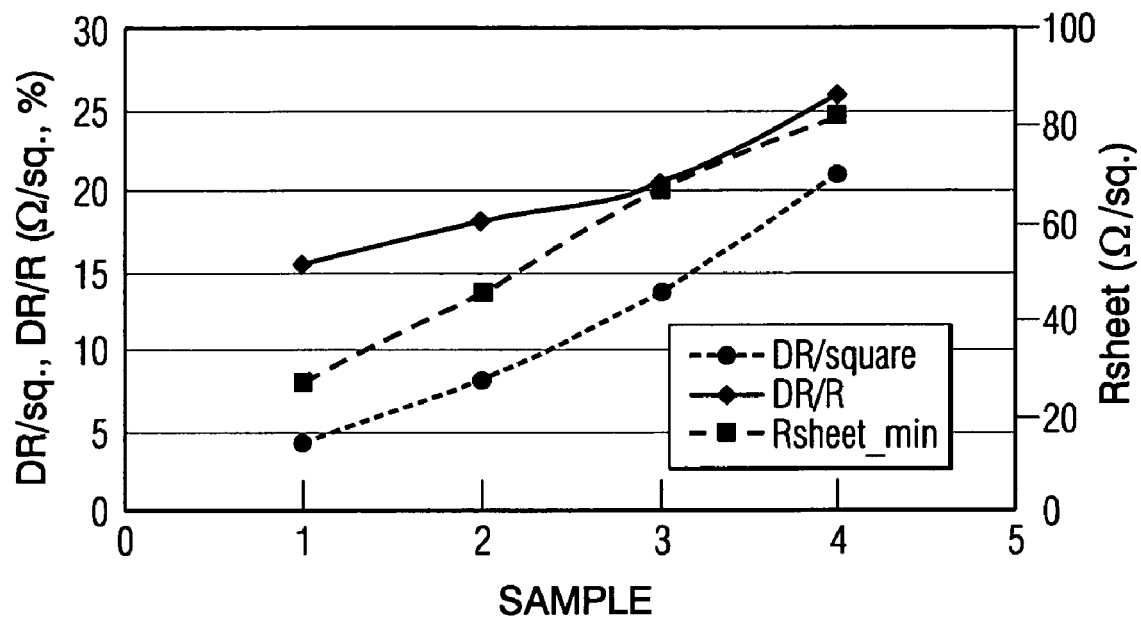
FIG. 26 is a graph of DR/sq. for several samples.
Figure 27:
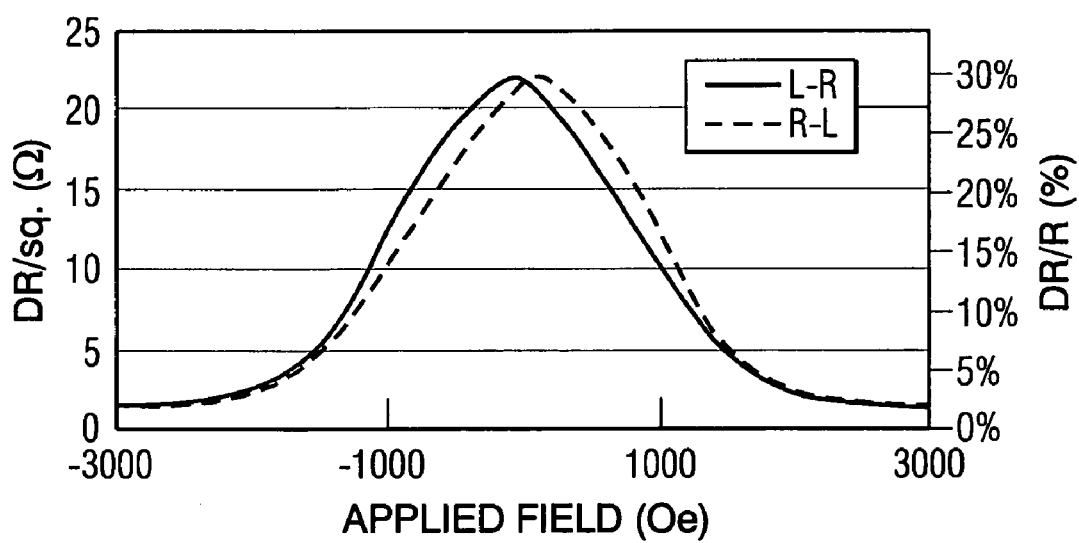
FIG. 27 is a graph of DR/sq. versus applied field.

The data for these examples is shown in FIG. 26. FIG. 27 shows a transfer curve for one of the larger GMR samples. This sample had a DR/sq. ~22 Ω/sq.; DR/R ~29%; and Rsheet ~75 Ω/sq.

Figure 28:
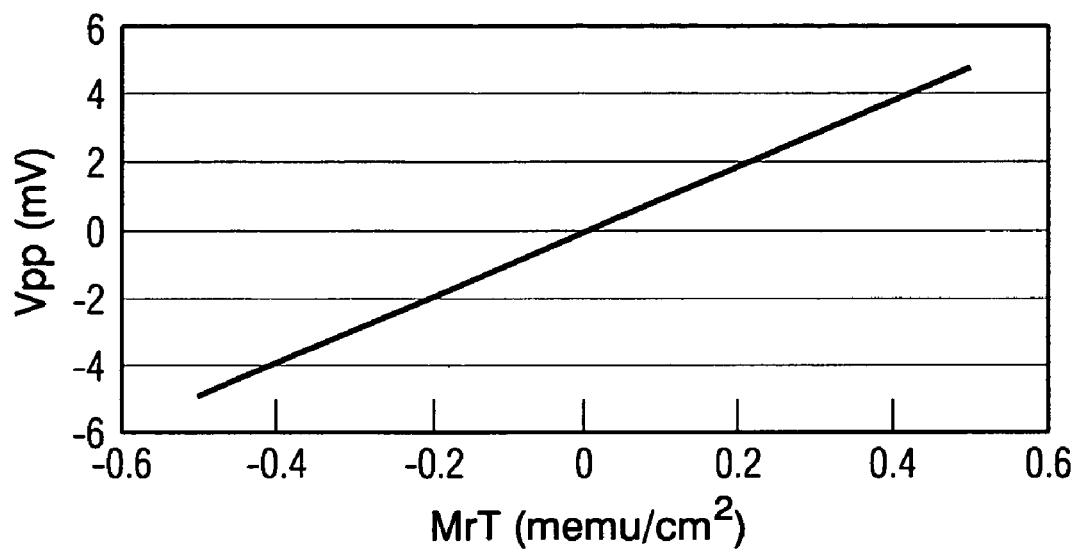
FIG. 28 is a graph of voltage versus magnetic thickness.

Micromagnetic modeling of a full magnetic recording head using the CIP sensor of this invention has been performed. The head included shields and a permanent magnet for biasing, and it read data from perpendicular media. The transfer curve for the head is shown in FIG. 28 versus perpendicular media magnetic thickness (MrT) where magnetic thickness is the product of the media's remanent magnetic moment density (Mr) and its physical thickness (T). The parameters used for the head were: DR/sq. ~20 Ω/sq.; DR/R ~25%; Rsheet ~80 Ω/sq., $J^{cu}=7.7\times 10^8$ A/cm$^2$ and J=−271 Oe, where $J_{cu}$ is the current density in the Cu and J is the interlayer coupling. A negative interlayer coupling corresponds to AFM coupling. This modeling predicts an output voltage of approximately 10 mV for perpendicular media with MrT=0.5 memu/cm$^2$. The signal is very linear and shows no hysteresis.

Figure 29:
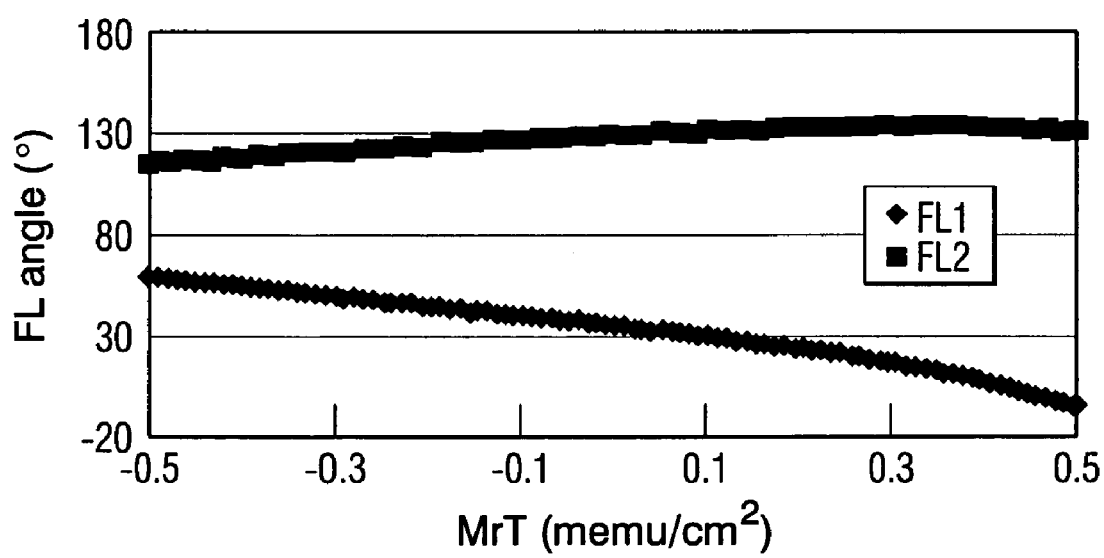
FIG. 29 is a graph of free layer angle versus magnetic thickness.

The graph of FIG. 29 shows the angle of the two free layers with respect to the ABS. The two free layers are not rotating symmetrically. The field from the current is adding to the PM field for one layer, which effectively pins that layer (PL1). The field from the current is subtracting from the PM field for the other layer (PL2), which effectively frees that layer. The modeling also shows that interlayer exchange coupling needs to be adjusted correctly to get the linear output.

Figure 30:
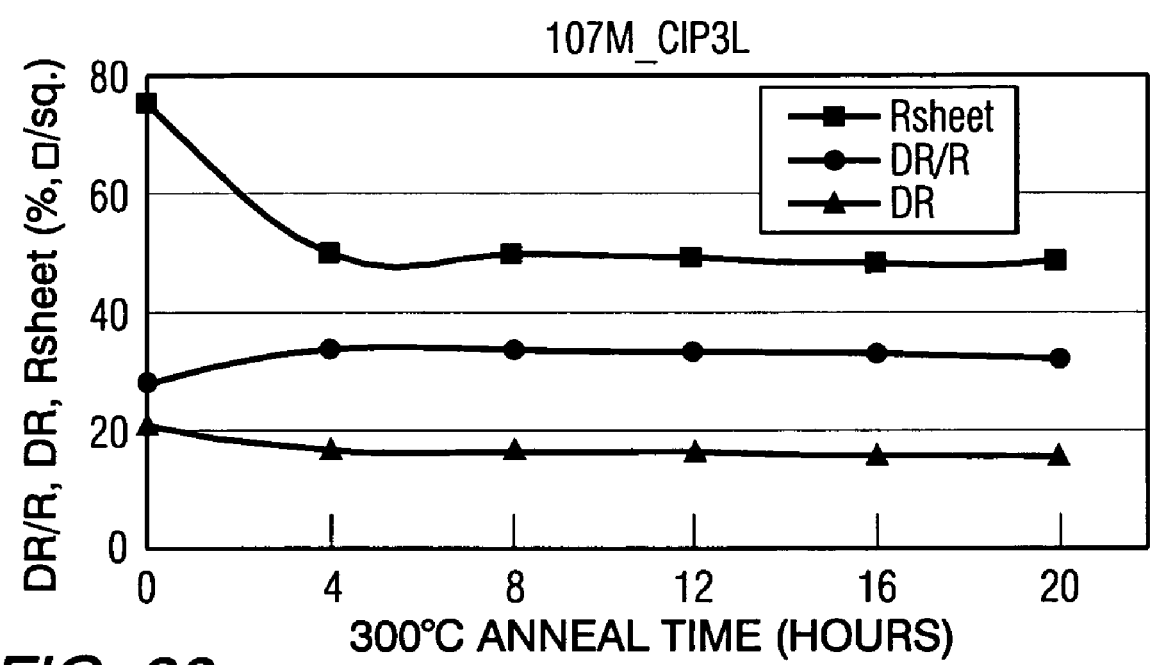
FIG. 30 is a graph of DR/R, DR and $R_{sheet}$ versus anneal time.

Thermal stability is an important consideration for these sensors. Thermally stable stacks have been achieved with DR/sq. ~16.5 Ω/sq.; DRR ~33%; and Rsheet ~50 Ω/sq. Thermal stability has been tested with 300° C. anneals and FIG. 30 shows data for a stack that has gone through several such anneals. The stack used for FIG. 30 is EtSla060/ NiFeCr20 Å/CoFe10 Å/RPO10020/CoFe15 Å/Cu10.5 Å/CoFe 15 Å/Cu4 Å/FeCo5 Å/RPO10020/(Al5 Å/RPO10020)×6, where EtSla060 is a sputter etch process and RP010020 is the oxidation process. The change in GMR with the first 300° C. anneal can be decreased by using a thicker NiFeCr seedlayer. This change in GMR is negligible for seedlayer thickness greater than or equal to 50 Å.

Thin Cu diffusion barriers have also been inserted at different locations to block the diffusion of oxygen. In the example used for FIG. 30, a thin Cu layer was positioned adjacent to the outer side of the top ferromagnetic free layer.

This invention provides CIP sensors that do not require an AFM pinning layer. By removing the pinning layer, no high temperature, high magnetic field anneal is needed to set the AFM pinning direction. In addition, there is much less current shunting, so more of the current remains in the layers that give the MR effect (FM/NM/FM), which leads to a larger GMR. Since the AFM is the thickest layer in a CIP-SV stack, removing the AFM allows for a decreased shield-to-shield spacing. Also, the FM/NM/FM layers are smoother without the thick AFM layer under them, so the NM layer can be made much thinner without having too large of Neel coupling.

This invention provides a CIP sensor that has a much larger output by increasing the DR/sq. The sensor is also thinner than a CIP-SV, which helps to increase the linear bit density by reducing the shield-to-shield spacing. In addition, the effect of specular scattering layers is greater in a thinner structure.

These sensors utilize AFM magnetostatic and FM or AFM RKKY coupling between two FM layers, and a magnetic bias field for biasing the layers such that their magnetizations are oriented ~90° with respect to each other.

The sensors of this invention can be used in magnetic storage systems such as disc drives or probe storage devices, or in any other devices where magnetic sensors are used.

While this invention has been described in terms of several examples, it will be understood by those skilled in the art that various changes can be made to the described examples without departing from the scope of the invention as set forth in the following claims.

What is claimed is:

1. A current-in-plane magnetic sensor comprising:
   a sensor stack including first and second layers of ferromagnetic material, a first nano-oxide layer positioned adjacent to the first layer of ferromagnetic material, and a layer of non-magnetic material positioned between the first and second layers of ferromagnetic material, wherein the thickness of the non-magnetic layer is selected to provide antiferromagnetic coupling between the first and second ferromagnetic layers;
   a magnetic field source for biasing the directions of magnetization of the first and second layers of ferromagnetic material in directions approximately 90° with respect to each other;
   a first lead connected to a first end of the sensor stack; and
   a second lead connected to a second end of the sensor stack.

2. The magnetic sensor of claim 1, wherein the layer of non-magnetic material has a thickness in the range of 5 to 12 Å.

3. The magnetic sensor of claim 1, wherein the first and second layers of ferromagnetic material each have a thickness in the range of 10 to 20 Å.

4. The magnetic sensor of claim 1, wherein the antiferromagnetic coupling between the first and second ferromagnetic layers comprises:
   RKKY coupling, magnetostatic coupling, or a combination of RKKY coupling and magnetostatic coupling.

5. The magnetic sensor of claim 1, wherein the first nano-oxide layer is formed by oxidizing a metallic layer.

6. The magnetic sensor of claim 5, wherein the metallic layer comprises a material selected from Al, Ta, Fe, Co and Ni, and alloys of Al, Ta, Fe, Co and Ni.

7. The magnetic sensor of claim 5, wherein the metallic layer has a thickness in the range of 5 to 15 Å.

8. The magnetic sensor of claim 1, further comprising:
   a substrate positioned adjacent to a first side of the sensor stack; and
   a cap layer positioned adjacent to the first nano-oxide layer, wherein the first nano-oxide layer is positioned adjacent to a second side of the sensor stack opposite the substrate.

9. The magnetic sensor of claim 8, wherein the cap layer comprises an insulator.

10. The magnetic sensor of claim 8, wherein the cap layer comprises a material selected from the group of: Al oxide, Fe oxide, Co oxide, Ni oxide, Ta, and TaN.

11. The magnetic sensor of claim 1, further comprising:
    a second nano-oxide layer positioned adjacent to the second layer of ferromagnetic material.

12. The magnetic sensor of claim 11, wherein the second nano-oxide layer is formed by oxidizing a metallic layer comprising a material selected from Fe, Co and Ni, and alloys of Fe, Co and Ni.

13. The magnetic sensor of claim 12, wherein the metallic layer has a thickness in the range of 5 to 15 Å.

14. The magnetic sensor of claim 11, further comprising:
    a seed layer positioned adjacent to the second nano-oxide layer.

15. The magnetic sensor of claim 14, wherein the seed layer comprises NiFeCr.

16. The magnetic sensor of claim 14, wherein the seed layer has a thickness less than 40 Å.

17. The magnetic sensor of claim 1, wherein the first ferromagnetic layer comprises a material selected from the group of CoFe, NiFe, Fe, Co and Ni, and alloys thereof, and the second ferromagnetic layer comprises a material selected from the group of CoFe, NiFe, Fe, Co and Ni, and alloys thereof.

18. The magnetic sensor of claim 1, wherein the magnetic field source comprises:
    a permanent magnet positioned adjacent to a side of the sensor stack.

19. The magnetic sensor of claim 18, wherein the side is opposite an air bearing side of the sensor stack.

20. The magnetic sensor of claim 1, further comprising:
    a diffusion layer positioned adjacent to the first nano-oxide layer.

21. The magnetic sensor of claim 1, wherein:
    AFM magnetostatic coupling between the first and second layers of ferromagnetic material is substantially balanced with the FM RKKY coupling.

* * * * *

UNITED STATES PATENT AND TRADEMARK OFFICE
CERTIFICATE OF CORRECTION

| | | |
|---|---|---|
| PATENT NO. | : 7,019,371 B2 | Page 1 of 1 |
| APPLICATION NO. | : 10/764720 | |
| DATED | : March 28, 2006 | |
| INVENTOR(S) | : Michael Allen Seigler | |

It is certified that error appears in the above-identified patent and that said Letters Patent is hereby corrected as shown below:

Column 8, Line 22
"DRR" should -- DR/R --

Column 8, Line 29
"RP010020" should read -- RPO10020 -- (zero should be O)

Signed and Sealed this

Twenty-second Day of August, 2006

JON W. DUDAS
*Director of the United States Patent and Trademark Office*

UNITED STATES PATENT AND TRADEMARK OFFICE
CERTIFICATE OF CORRECTION

PATENT NO. : 7,019,371 B2 Page 1 of 1
APPLICATION NO. : 10/764720
DATED : March 28, 2006
INVENTOR(S) : Michael Allen Seigler It is certified that error appears in the above-identified patent and that said Letters Patent is hereby corrected as shown below:

Column 8, Line 22
"DRR" should read -- DR/R --

Column 8, Line 29
"RP010020" should read -- RPO10020 -- (zero should be O)

Signed and Sealed this

Fourteenth Day of November, 2006

JON W. DUDAS
*Director of the United States Patent and Trademark Office*